United States Patent
Huang et al.

(10) Patent No.: US 8,940,590 B1
(45) Date of Patent: Jan. 27, 2015

(54) THIN FILM TRANSISTOR AND METHOD FOR FABRICATING THE SAME

(71) Applicant: Chunghwa Picture Tubes, Ltd., Taoyuan (TW)

(72) Inventors: Yen-Yu Huang, Taoyuan County (TW); Hsi-Ming Chang, Taoyuan County (TW)

(73) Assignee: Chunghwa Picture Tubes, Ltd., Taoyuan County (TW)

( * ) Notice: Subject to any disclaimer, the term of this patent is extended or adjusted under 35 U.S.C. 154(b) by 0 days.

(21) Appl. No.: 14/018,448

(22) Filed: Sep. 5, 2013

(30) Foreign Application Priority Data

Jul. 25, 2013  (TW) .............................. 102126709 A

(51) Int. Cl.
  *H01L 21/84*  (2006.01)
  *H01L 29/06*  (2006.01)
  *H01L 29/786* (2006.01)
  *H01L 29/66*  (2006.01)

(52) U.S. Cl.
  CPC ........ *H01L 29/786* (2013.01); *H01L 29/66742* (2013.01)
  USPC .......................................... 438/151; 257/347

(58) Field of Classification Search
  CPC ...................... H01L 29/66765; H01L 29/7869; H01L 29/69969; H01L 27/12; H01L 27/7869; H01L 27/7863; H01L 29/786; H01L 29/66742
  USPC ............ 257/43, 347, 66, 9; 438/104, 34, 149, 438/151
  See application file for complete search history.

(56) References Cited

U.S. PATENT DOCUMENTS

| 7,442,588 | B2 | 10/2008 | Jang et al. | |
| 8,053,773 | B2 * | 11/2011 | Shin et al. | 257/43 |
| 2008/0303020 | A1 * | 12/2008 | Shin et al. | 257/43 |
| 2011/0233536 | A1 | 9/2011 | Kim et al. | |
| 2013/0313546 | A1 * | 11/2013 | Yu | 257/43 |

FOREIGN PATENT DOCUMENTS

TW        200952178       12/2009

* cited by examiner

*Primary Examiner* — Nikolay Yushin
(74) *Attorney, Agent, or Firm* — Jianq Chyun IP Office

(57) ABSTRACT

The present provides a method for fabricating a thin film transistor including following steps. A substrate is provided. A gate is formed above the substrate. A first source is formed above the substrate. A channel is formed, in which one end of the channel contacts with the first source. A stop layer covering the one end of the channel and exposing another end of the channel is formed. A drain connected with the other end of the channel is formed. Moreover, the present invention also provides a thin film transistor fabricated by the method.

12 Claims, 10 Drawing Sheets

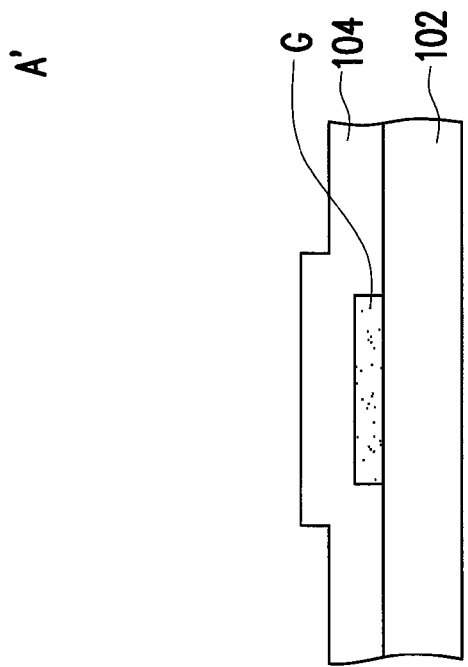
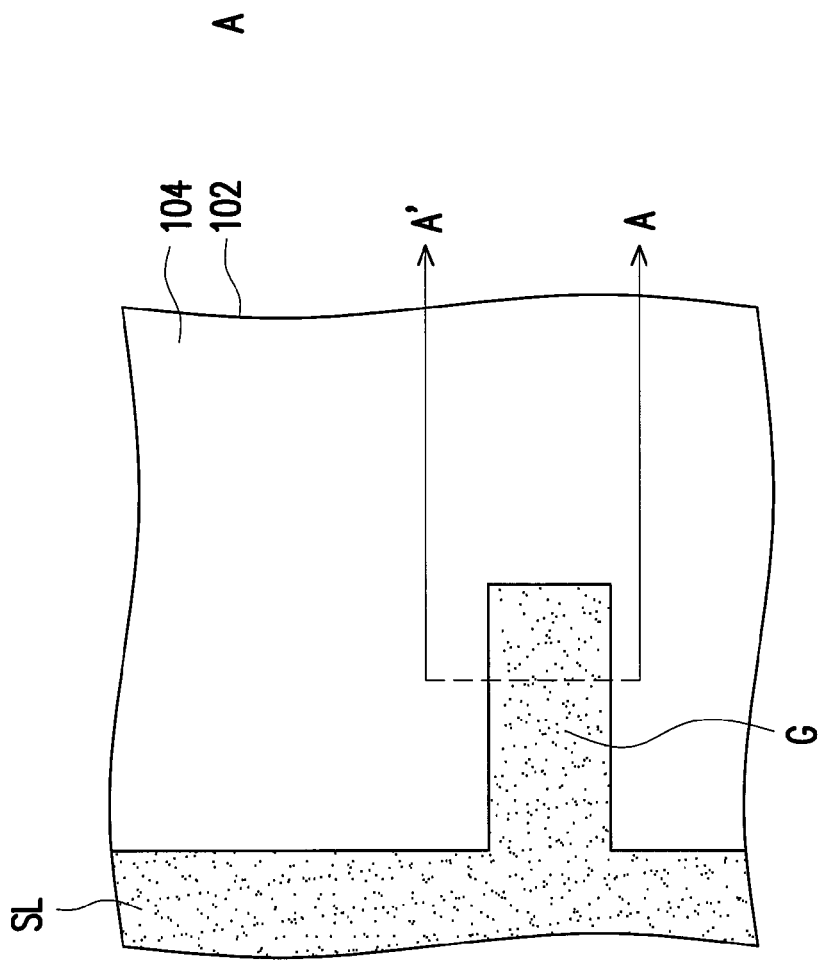
FIG. 1A
FIG. 2A

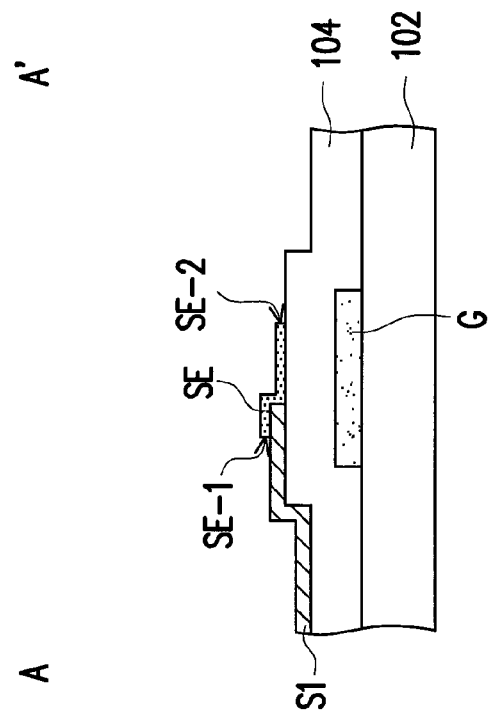
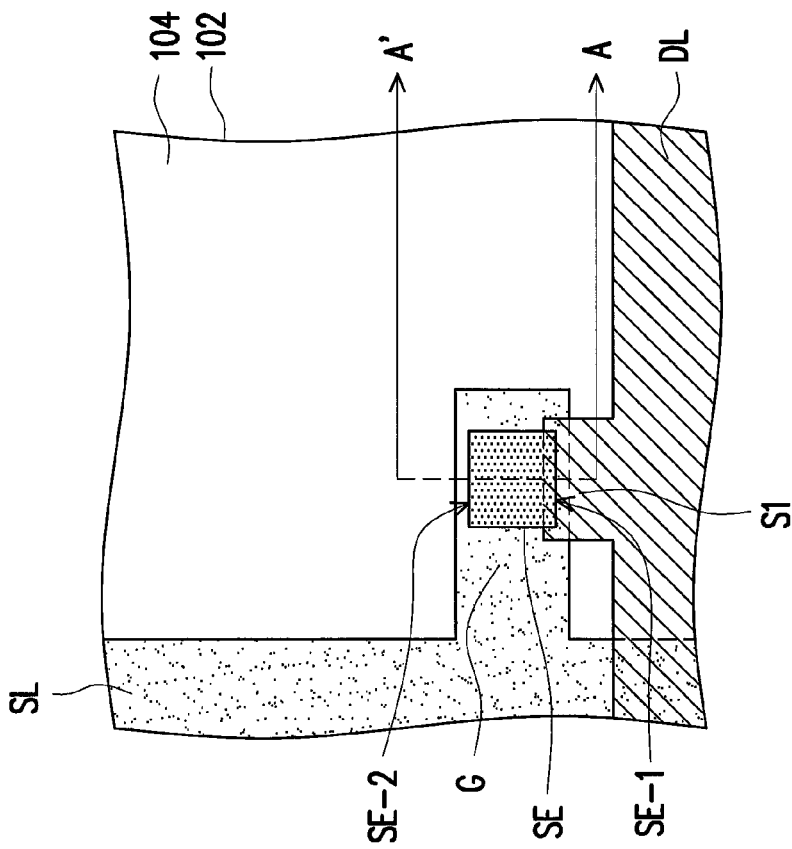
FIG. 2C
FIG. 1C

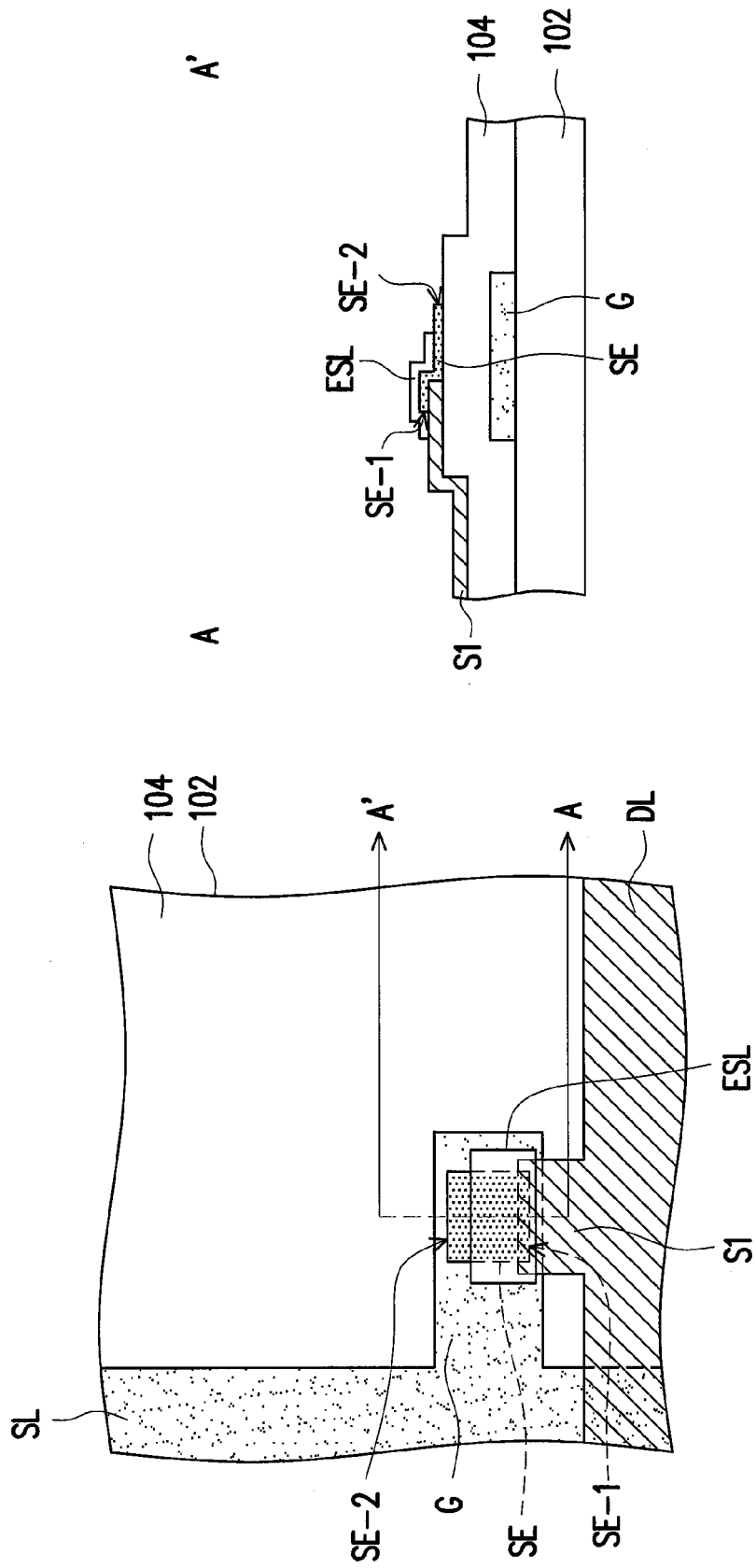

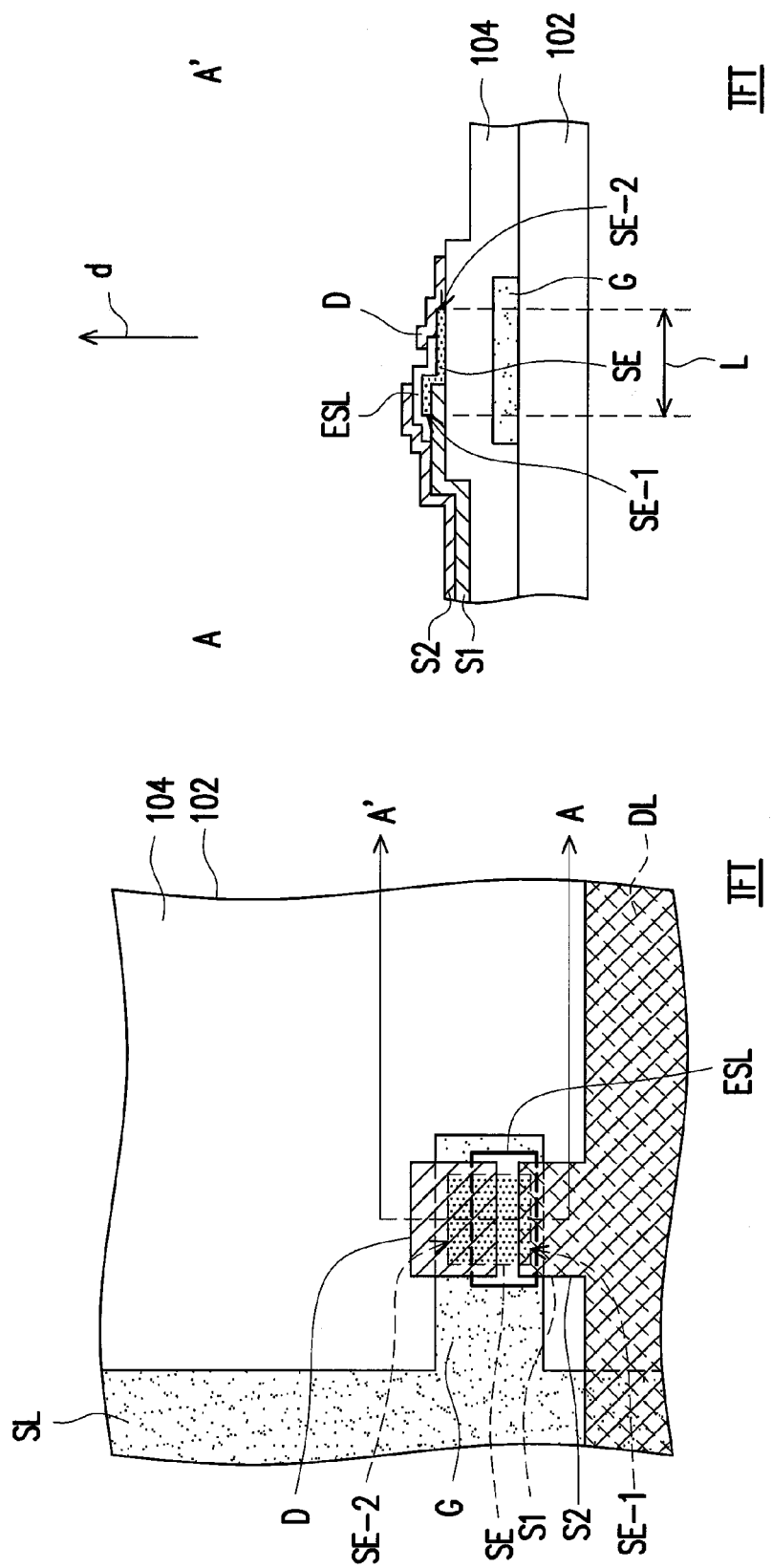

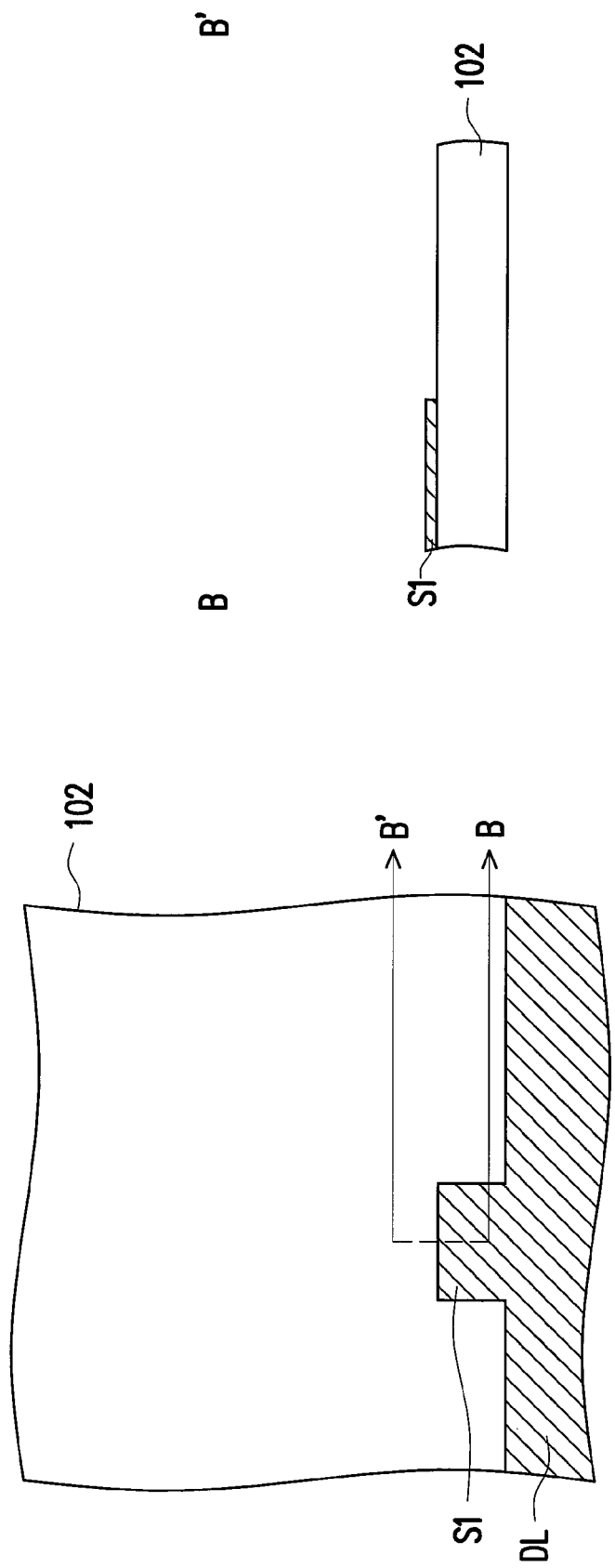

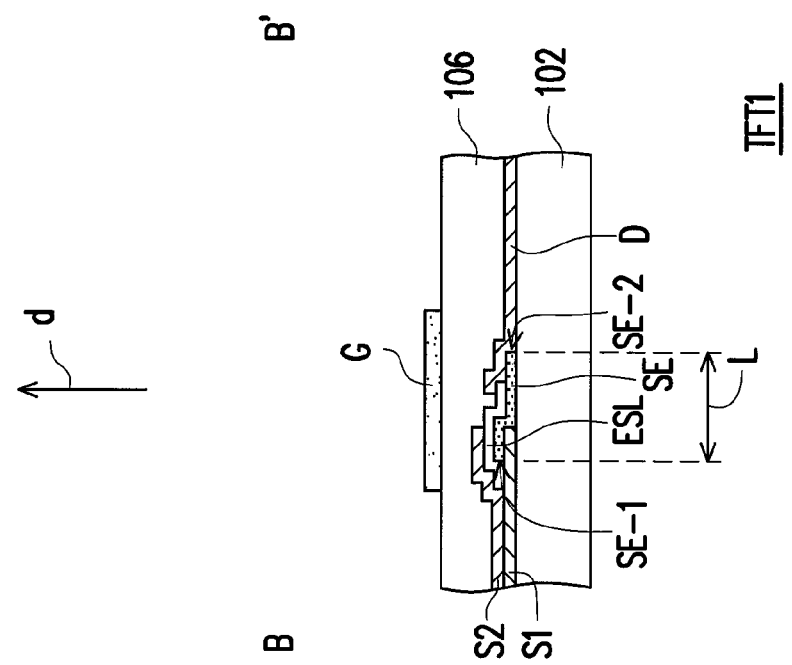
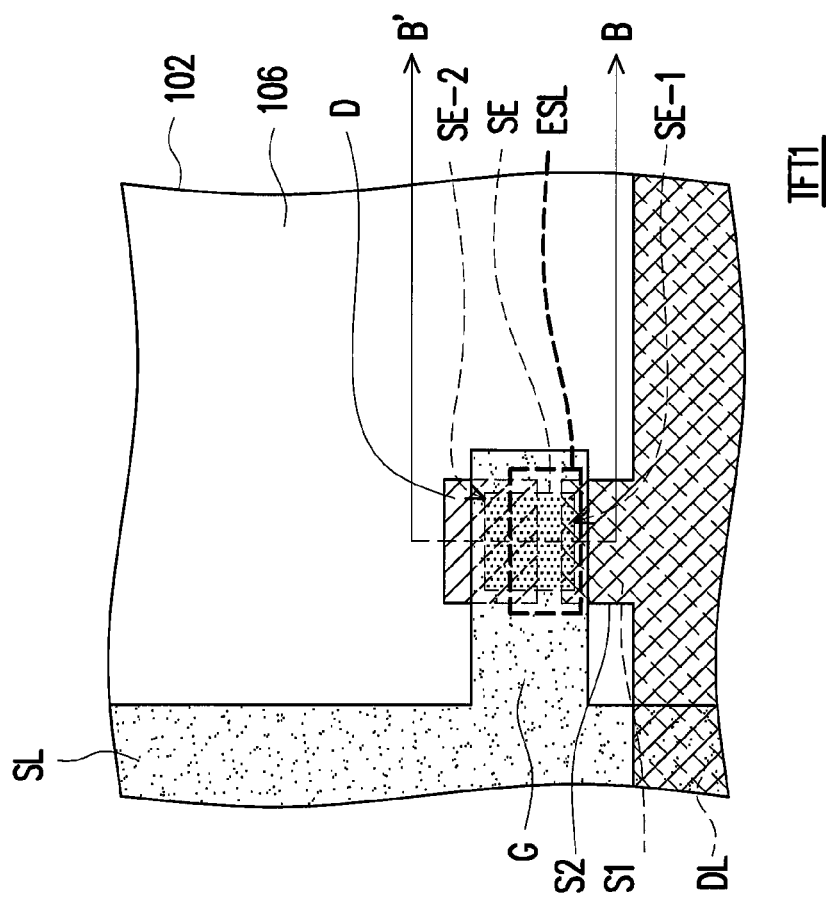
FIG. 3E
FIG. 4E

US 8,940,590 B1

THIN FILM TRANSISTOR AND METHOD FOR FABRICATING THE SAME

CROSS-REFERENCE TO RELATED APPLICATION

This application claims the priority benefit of Taiwan application serial no. 102126709, filed on Jul. 25, 2013. The entirety of the above-mentioned patent application is hereby incorporated by reference herein and made a part of this specification.

BACKGROUND

1. Field of the Invention

The present invention is directed to an electronic device and a method for fabricating the same. More particularly, the present invention is directed to a thin film transistor and a method for fabricating the same.

2. Description of Related Art

With the improvement of technology, miniaturization of electronic components has become a trend. Certainly, thin film transistors also have no exception. In the conventional technique, a thin film transistor includes a gate, a source, a drain, an etch stop layer and a channel. Therein, the source and the drain belong to the same layer and respectively on two sides of the channel, the gate overlaps the channel, the etch stop layer has two contacts for exposing an upper surface of the channel, and the source and the drain are respectively filled in the contacts to contact with the channel. However, the presence of the contacts leads the channel in retaining an area to be exposed from the contacts, which is unfavorable for reducing the size of the thin film transistor.

SUMMARY

The present invention is directed to a method for fabricating a thin film transistor, which is capable of fabricating a small-area thin film transistor.

The present invention is directed to a thin film transistor having a small area.

The present invention provides a method for fabricating a thin film transistor including steps as follows. A substrate is provided. A gate is formed above the substrate. A first source is formed above the substrate. A channel is formed, and one end of the channel contacts with the first source. An etch stop layer is formed, and the etch stop layer at least covers the one end of the channel which contacts with the first source and exposes another end of the channel. A drain is formed, and the drain contacts with another end of the channel.

The present invention provides a thin film transistor including a substrate, a first source disposed above the substrate, a channel, an etch stop layer, a drain and a gate. One end of the channel contacts with the first source. The etch stop layer at least covers the one end of the channel which contacts with the first source and exposes another end of the channel. The drain contacts with another end of the channel. The gate overlaps the channel.

In an embodiment of the present invention, the method for fabricating the thin film transistor further includes forming a second source above the first source while forming the drain.

In an embodiment of the present invention, the second source entirely covers the first source.

In an embodiment of the present invention, the method further includes forming an insulation layer covering the gate.

In an embodiment of the present invention, the method further includes forming an insulation layer covering the first source, the channel, the etch stop layer and the drain.

In an embodiment of the present invention, the first source and the drain respectively belong to different layers.

In an embodiment of the present invention, the first source, the channel, the etch stop layer and the drain are stacked in sequence toward a direction that is away from the substrate.

In an embodiment of the present invention, the thin film transistor further includes a second source disposed above the first source and belonging to the same layer as the drain.

In an embodiment of the present invention, the second source contacts with the first source.

In an embodiment of the present invention, the second source is aligned with the first source.

In an embodiment of the present invention, the thin film transistor further includes an insulation layer, and the gate is disposed between the insulation layer and the substrate.

In an embodiment of the present invention, the thin film transistor further includes an insulation layer disposed between the gate and the substrate.

To sum up, in the thin film transistor and the method for fabricating the same of the present invention, the first source and the drain of the thin film transistor are respectively formed above an upper side and a lower side of the channel and respectively contact with the two ends of the channel. Thus, the contact region exposed by the two contacts of the channel does not have to be retained, which is different from what the conventional technique does. Accordingly, an effective length of the channel may be significantly reduced so as to facilitate in reducing the area of the thin film transistor.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

FIG. 1A through FIG. 1E are schematic top views illustrating a method for fabricating a thin film transistor according to an embodiment of the present invention.

FIG. 2A through FIG. 2E are schematic cross-sectional views illustrating a method for fabricating a thin film transistor according to an embodiment of the present invention.

FIG. 3A through FIG. 3E are schematic top views illustrating a method for fabricating a thin film transistor according to another embodiment of the present invention.

FIG. 4A through FIG. 4E are schematic cross-sectional views illustrating a method for fabricating a thin film transistor according to another embodiment of the present invention.

DESCRIPTION OF EMBODIMENTS

Figure 2B:
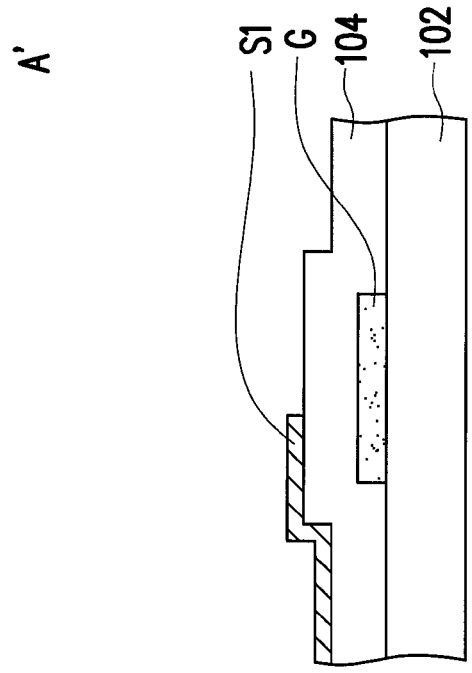
Figure 1B:
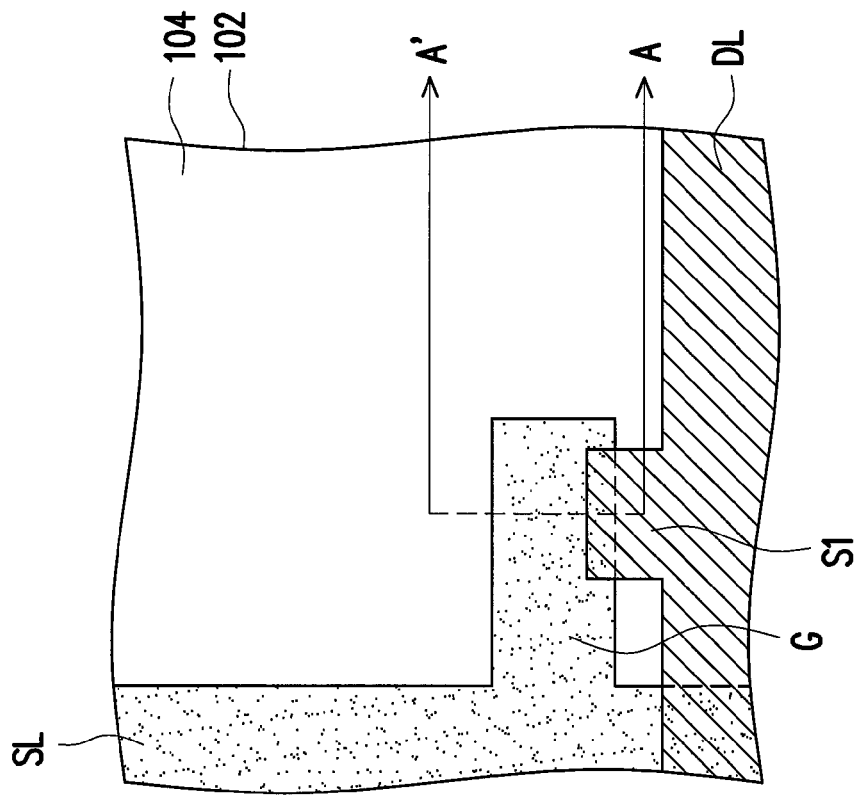

FIG. 1A through FIG. 1E are schematic top views illustrating a method for fabricating a thin film transistor according to an embodiment of the present invention. FIG. 2A through FIG. 2E are schematic cross-sectional views illustrating a method for fabricating a thin film transistor according to an embodiment of the present invention. Specially, FIG. 2A through FIG. 2E are schematic cross-sectional views respectively corresponding to FIG. 1A through FIG. 1E along a along a section line A-A'. Referring to FIG. 1A and FIG. 2A, a substrate 102 is first provided. The substrate 102 is used to carry elements, and a material of the substrate 102 may be glass, quartz, organic polymer or any other opaque/reflective material (e.g. wafers or ceramics) or any other suitable material.

Then, a gate G is formed above the substrate 102. In the present embodiment, if the fabricated thin film transistor is applied to the display field, a scan line SL electrically connected with the gate G may be further formed while forming the gate G. The gate G and the scan line SL are generally made of metallic materials, but the present invention is not limited thereto. In other embodiments, the gate G and the scan line SL may also be made of other conductive materials, such as an alloy, metal nitride, metal oxide, metal oxynitride, or a combination thereof. Thereafter, an insulation layer 104 may be formed. The insulation layer 104 covers the gate G. The insulation layer 104 may be made of inorganic materials (e.g. silicon oxide, silicon nitride or silicon oxynitride), an organic material or a combination thereof.

Referring to FIG. 1B and FIG. 2B, a first source S1 is then formed above the substrate 102. In the present embodiment, if the fabricated thin film transistor is applied to the display field, a data line DL electrically connected with the first source S1 may be further formed while forming the first source S1. The insulation layer 104 is located between the first source S1 and the substrate 102. The first source S1 and the data line DL are generally made of metallic materials, but the present invention is not limited thereto. In other embodiments, the first source S1 and the data line DL may also be made of other conductive materials, such as an alloy, metal nitride, metal oxide, metal oxynitride, or a combination thereof.

Referring to FIG. 1C and FIG. 2C, a channel SE is formed afterward. One end SE-1 of the channel SE contacts and is electrically connected with the first source S1. In the present embodiment, a material of the channel SE may be, for example, metal oxide semiconductor, such as indium-gallium-zinc oxide (IGZO), indium zinc oxide (IZO), indium gallium oxide (IGO), zinc oxide (ZnO), $2CdO.GeO_2$, or $NiCo_2O_4$, but the present invention is not limited thereto.

Referring to FIG. 1D and FIG. 2D, then, an etch stop layer ESL is formed. The stop layer ESL at least covers the one end SE-1 of the channel SE which contacts with the first source S1 and exposes another end SE-2 of the channel SE. The etch stop layer ESL is capable of protecting the channel SE therebelow, such that the channel SE will not be easily damaged in subsequent fabricating processes. In the present embodiment, the etch stop layer ESL is a complete pattern. In other words, the etch stop layer ESL does not contain any contact exposing the channel SE inside.

Referring to FIG. 1E and FIG. 2E, a drain D is subsequently formed. The drain D contacts and is electrically connected with said another end SE-2 of the channel SE. Up to this step, the fabrication of a thin film transistor TFT of the present embodiment is initially completed. In the present embodiment, while forming the drain D, a second source S2 disconnected from the drain D may also be formed above the first source S1. The second source S2 may entirely cover the first source S1. The second source S2 is capable of protecting the first source S1 therebelow, such that the first source S1 will not be easily damaged during the process of forming the drain D. However, the present invention is not limited thereto. In other embodiments, the first source S1 may be prevented from being damaged by adopting other means. For example, in other embodiments, different materials may be selected for fabricating the drain D and the first source S1. By doing so, an etching solution having a great etching selectivity of the drain D to the first source S1 may be selected for forming the drain D, such that first source S1 will not be easily damaged during the process of forming the drain D. In other words, through the selection of the materials and of the etching solutions for the drain D and the first source S1, in other embodiments, the second source S2 may not have to be formed while forming the drain D.

Referring to FIG. 1E and FIG. 2E, the thin film transistor TFT of the present embodiment includes the substrate 102, the first source S1 disposed above the substrate 102, the channel SE, the etch stop layer ESL, the drain D and the gate G overlapping the channel SE. The one end SE-1 of the channel SE contacts and is electrically connected with the first source S1. Moreover, in the present embodiment, the one end SE-1 of the channel SE may cover the first source S1. The first source S1 is located between the channel SE and the substrate 102. The etch stop layer ESL at least covers the one end SE-1 of the channel SE which contacts with the first source S1 and exposes said another end SE-2 of the channel SE. The drain D contacts with said another end SE-2 of the channel SE and is electrically connected therewith. In the present embodiment, each of the two ends SE-1 and SE-2 of the channel SE respectively has one of two edges of the channel SE, and the two edges may respectively cover the first source S1 and be covered by the drain D.

In the present embodiment, the first source S1 and the drain D belong to different layers. The drain D and the first source S1 are respectively located above an upper side and a lower side of the channel SE. In other words, the channel SE is located between the first source S1 and the drain D. Moreover, the first source S1, the channel SE, the etch stop layer ESL and the drain D may be stacked in sequence toward a direction that is away from the substrate 102.

The thin film transistor TFT of the present embodiment may selectively include the second source S2 disconnected from the drain D. The second source S2 is disposed above the first source S1 and belongs to the same layer as the drain D. The second source S2 may contact with the first source S1 and be electrically connected therewith. The second source S2 may entirely cover the first source S1. Moreover, the second source S2 may be aligned with the first source S1 along a direction d in which the gate G and the channel SE are stacked.

It is to be mentioned that in the present embodiment, the drain D of the thin film transistor TFT and the first source S1 are respectively formed above the upper side and the lower side of the channel SE and contact with the two ends of the channel SE. Thus, the channel SE does not have to retain the contact region exposed by the two contacts of the etch stop layer ESL like the way the conventional technique does. Accordingly, an effective length L of the channel SE may be significantly reduced, which facilitates in reducing the size of the thin film transistor TFT.

The thin film transistor TFT of the present embodiment further includes the insulation layer 104. In the present embodiment, the gate G may be disposed between the insulation layer 104 and the substrate 102. In other words, the thin film transistor TFT of the present embodiment may be a bottom gate thin film transistor (bottom gate TFT). However, the present invention is not limited thereto, and the conception of the present invention may also be applied to any other form of thin film transistor, such as a top gate thin film transistor (top gate TFT), which will be specifically described with reference to FIG. 3A through FIG. 3E and FIG. 4A through FIG. 4E.

FIG. 3A through FIG. 3E are schematic top views illustrating a method for fabricating a thin film transistor according to another embodiment of the present invention. FIG. 4A through FIG. 4E are schematic cross-sectional views illustrating a method for fabricating a thin film transistor according to another embodiment of the present invention. Specially, FIG. 4A through FIG. 4E are schematic cross-sectional views respectively corresponding to FIG. 3A through FIG. 3E along a along a section line B-B'. The method for fabricating the thin film transistor illustrated in FIG. 3A through FIG. 3E and FIG. 4A through FIG. 4E is similar to that illustrated in FIG. 1A through FIG. 1E and FIG. 2A through FIG. 2E, and therefore, identical elements are labeled by the same numerals.

Figure 4B:
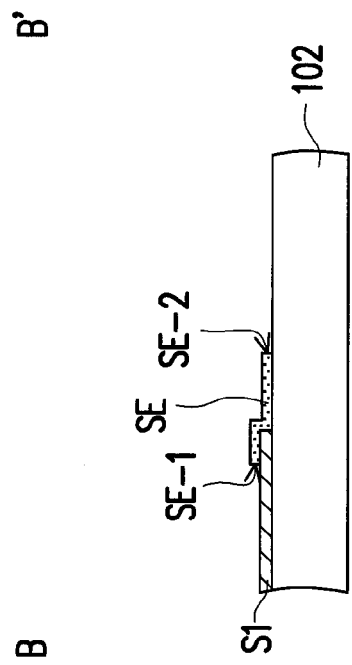
Figure 3B:
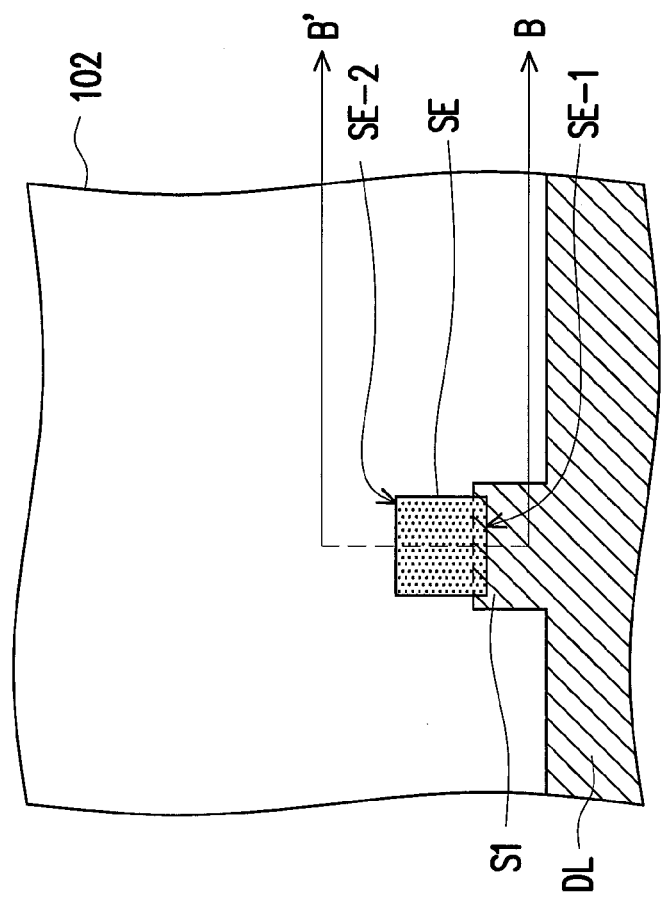
Figure 4C:
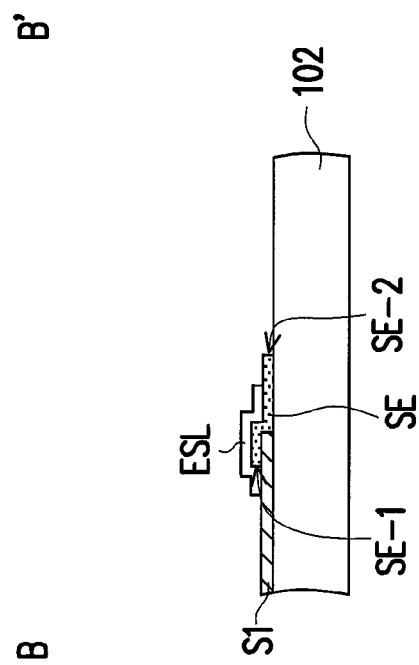
Figure 3C:
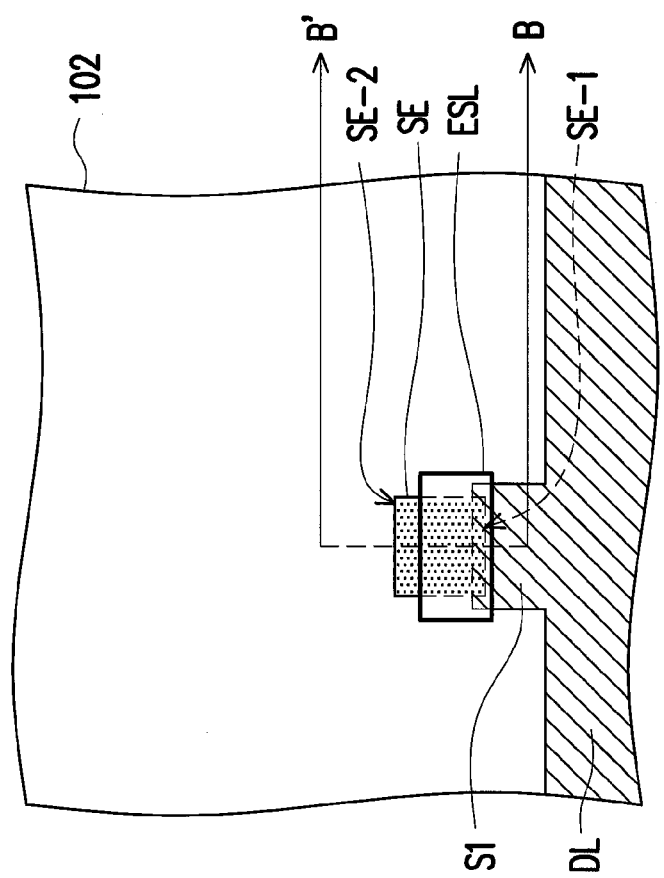

Referring to FIG. 3A and FIG. 4A, a substrate 102 is first provided. Then, a first source S1 is formed above the substrate 102. Referring to FIG. 3B and FIG. 4B, a channel SE is then formed. One end SE-1 of the channel SE contacts with the first source S1. Referring to FIG. 3C and FIG. 4C, an etch stop layer ESL is formed afterward. The etch stop layer ESL at least covers the one end SE-1 of the channel SE which contacts with the first source S1 and exposes another end SE-2 of the channel SE.

Figures 3D, 4D:
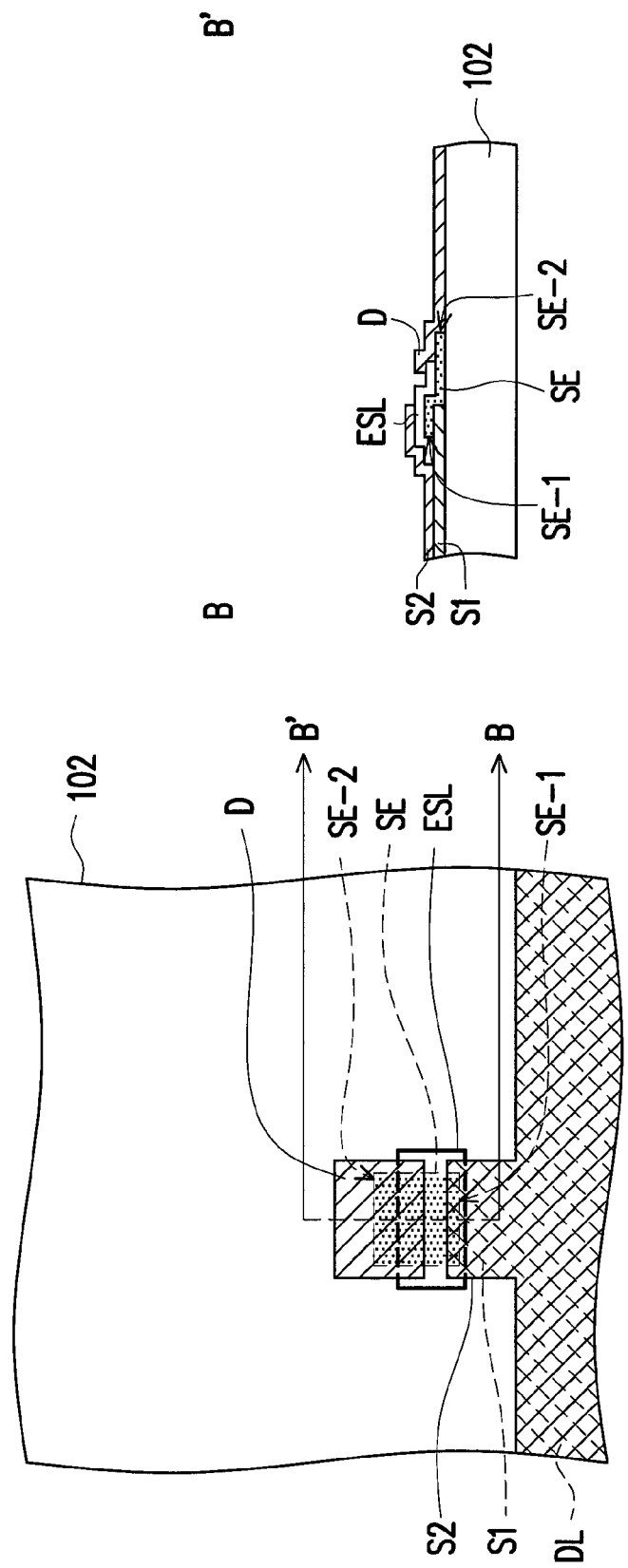

Referring to FIG. 3D and FIG. 4D, subsequently, a drain D is formed. The drain D contacts with said another end SE-2 of the channel SE. Similarly, a second source S2 may also be selectively formed above the first source S1 while forming the drain D for protecting the first source S1 during the process of forming the drain D. Referring to FIG. 3E and FIG. 4E, thereafter, an insulation layer 106 is formed to cover the first source S1, the channel SE, the etch stop layer ESL and the drain D.

Referring to FIG. 3E and FIG. 4E, a thin film transistor TFT1 is similar to the thin film transistor TFT, and thus, identical elements are labeled by the same numerals. Similarly, the thin film transistor TFT1 includes the substrate 102, the first source S1 disposed above the substrate 102, the channel SE, the etch stop layer ESL, the drain D and the gate G overlapping the channel SE. The one end SE-1 of the channel SE contacts with the first source S1. The etch stop layer ESL at least covers the one end SE-1 of the channel SE which contacts with the first source S1 and exposes said another end SE-2 of the channel SE. The drain D contacts said another end SE-2 of the channel SE. Differing from the embodiment above, the thin film transistor TFT1 of the present embodiment further includes the insulation layer 106, and the insulation layer 106 is disposed between the gate G and the substrate 102. In addition, the first source S1, the channel SE, the etch stop layer ESL, the drain D, the insulation layer 106 and the gate G are stacked in sequence toward a direction that is away from the substrate 102. In other words, the thin film transistor TFT1 may be a top gate thin film transistor (top gate TFT). The thin film transistor TFT1 also has the same effect and advantages as the thin film transistor TFT, which will not be repeatedly described hereinafter.

Based on the above description, in the thin film transistor and the method for fabricating the same according to an embodiment of the present invention, the drain of the thin film transistor the first source and the first source the drain of the thin film transistor are respectively formed above an upper side and a lower side of the channel and respectively contact with the two ends of the channel. Thus, the channel does not have to retain the contact region exposed by the two contacts like the way the conventional technique does. Accordingly, an effective length of the channel may be significantly reduced so as to facilitate in reducing the size of the thin film transistor.

Moreover, in the thin film transistor and the method for fabricating the same according to another embodiment of the present invention, the second source disconnected from the drain can be formed above the first source while forming the drain. By doing so, the second source can protect the first source therebelow during the process of forming the drain, such that the first source will not be easily damaged during the process of forming the drain. Accordingly, the thin film transistor can have a high yield.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for fabricating a thin film transistor, comprising:
   providing a substrate;
   forming a gate above the substrate;
   forming a first source above the substrate;
   forming a channel, wherein one end of the channel contacts with the first source;
   forming an etch stop layer, wherein the etch stop layer at least covers the one end of the channel which contacts with the first source and exposes another end of the channel;
   forming a drain, wherein the drain contacts with said another end of the channel; and
   forming a second source above the first source while forming the drain.

2. The method according to claim 1, wherein the second source entirely covers the first source.

3. The method according to claim 1, further comprising:
   forming an insulation layer, wherein the insulation layer covers the gate.

4. The method according to claim 1, further comprising:
   forming an insulation layer, wherein the insulation layer covers the first source, the channel, the etch stop layer and the drain.

5. A thin film transistor, comprising:
   a substrate;
   a first source, disposed above the substrate;
   a channel, wherein one end of the channel contacts with the first source;
   an etch stop layer, wherein the etch stop layer at least covers the one end of the channel which contacts with the first source and exposes another end of the channel;
   a drain, contacting with another end of the channel, wherein the first source and the drain belong to different layers; and
   a gate, overlapping the channel.

6. The thin film transistor according to claim 5, wherein the first source, the channel, the etch stop layer and the drain are stacked in sequence toward a direction that is away from the substrate.

7. The thin film transistor according to claim 5, further comprising:
   a second source, disposed above the first source and belonging to the same layer as the drain.

8. The thin film transistor according to claim 7, wherein the second source entirely covers the first source.

9. The thin film transistor according to claim 7, wherein the second source contacts with the first source.

10. The thin film transistor according to claim 7, wherein the second source is aligned with the first source.

11. The thin film transistor according to claim 5, further comprising:
   an insulation layer, wherein the gate is disposed between the insulation layer and the substrate.

12. The thin film transistor according to claim 5, further comprising:
   an insulation layer, disposed between the gate and the substrate.

* * * * *